United States Patent

Buitendijk

[11] Patent Number: 4,894,622
[45] Date of Patent: Jan. 16, 1990

[54] INTEGRATED CURRENT-MIRROR ARRANGEMENT COMPRISING VERTICAL TRANSISTORS

[75] Inventor: Pieter Buitendijk, Nijmegen, Netherlands

[73] Assignee: U.S. Philips Corporation, New York, N.Y.

[21] Appl. No.: 281,565

[22] Filed: Dec. 8, 1988

[30] Foreign Application Priority Data

Jun. 15, 1988 [NL] Netherlands ............... 8801520

[51] Int. Cl.[4] .................................... H03F 3/24
[52] U.S. Cl. .................................... 330/288; 330/307; 357/46
[58] Field of Search ........... 330/257, 288, 307; 323/315, 316; 357/46, 86

[56] References Cited

U.S. PATENT DOCUMENTS 4,371,792 2/1983 Dobkin ............... 357/46 X

FOREIGN PATENT DOCUMENTS 3609629 10/1986 Fed. Rep. of Germany .

Primary Examiner—James B. Mullins
Attorney, Agent, or Firm—Bernard Franzblau

[57] ABSTRACT

An integrated current-mirror arrangement comprises a first and a second transistor whose bases are interconnected and connected to the collector of the first transistor. The transistors are constructed as vertical transistors each having a collector region (23a, 23b) of the first conductivity type, isolated from the substrate (21) of the first conductivity type by an intermediate layer (22) of the second conductivity type. A connection is provided between said intermediate layer (22) and the interconnected bases (29, 30) of the two transistors which improves the high-frequency transfer function between input and output and effectively eliminates the capacitive path for interference signals from the voltage supply line (+V) to the output.

6 Claims, 2 Drawing Sheets

INTEGRATED CURRENT-MIRROR ARRANGEMENT COMPRISING VERTICAL TRANSISTORS

BACKGROUND OF THE INVENTION

This invention relates to an integrated current-mirror arrangement comprising a first and a second transistor whose bases are interconnected and coupled to the collector of the first transistor.

Current-mirror arrangements are known per se in a wide variety and therefore require no further explanation. If a current-mirror arrangement is to be realized by means of vertical transistors, the problem arises that in vertical transistors the parasitic capacitances formed between the collector region and the intermediate layer separating the collector region from the substrate adversely affect the correction operation of the arrangement. Said intermediate layer, which is of a conductivity type opposite to that of the collector regions, should be at such a voltage that the junction between the collector region and said intermediate layer and the junction between the substrate and the intermediate layer cannot be turned on. For this purpose the intermediate layer is normally connected to a positive power-supply terminal or to the emitter of the relevant vertical transistor. In the case of a current-mirror arrangement this would result in the parasitic capacitance between the collector region and the intermediate layer being connected in parallel with the main current path of the transistor, which gives rise to an undesirable high-frequency pole in the transfer function between the input current and the output current of the current-mirror arrangement. Moreover, it results in an undesirable capacitive connection for interference signals from the power-supply line to the output current terminal.

SUMMARY OF THE INVENTION

It is an object of the invention to provide an integrated current-mirror arrangement utilizing vertical transistors, but without the problems stated above.

According to the invention, an integrated current-mirror arrangement comprising a first and a second transistor whose bases are interconnected and coupled to the collector of the first transistor is characterized in that the transistors are constructed as vertical transistors each having a collector region of a first conductivity type, isolated from the substrate of the first conductivity type by an intermediate layer of a second conductivity type, a connection being provided between said intermediate layers and the interconnected bases of the two transistors.

BRIEF DESCRIPTION OF THE DRAWINGS

An embodiment of the invention will now be described in more detail, by way of example, with reference to the accompanying in which.

DESCRIPTION OF THE PREFERRED EMBODIMENTS

Figure 1:
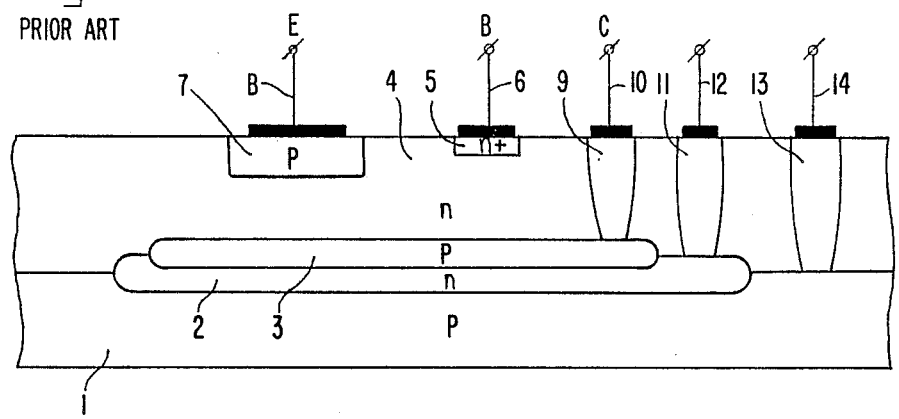
FIG. 1 shows diagrammatically a sectional view of an integrated vertical transistor known per se.

FIG. 1 shows an integrated vertical transistor, known per se, of a type as described, for example, in DE 3,609,629. The vertical transistor structure comprises a p-type substrate 1 on which an n-type isolating layer 2 is situated, a p-type collector region 3 being situated on said isolating layer. The n-type base region 4 is situated on the collector region 3 and is connected to the base terminal 6 via a highly doped n+ island 5. In the base region 4 a p-doped emitter region 7 is formed on which the emitter terminal 8 is arranged. The collector region 3 is connected to the collector terminal 10 via a p+ doped region 9. The intermediate layer 2 is connected to a terminal 12 via an n+ doped region 11 and the substrate may be connected to a substrate terminal 14 via a p+ doped region 13.

Figure 2A:
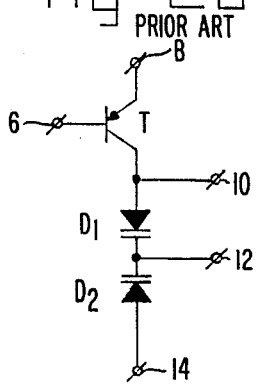
FIGS. 2a and 2b show two equivalent diagrams of the transistor shown in FIG. 1, in which the parasitic capacitances and parasitic junctions are indicated.
Figure 2B:
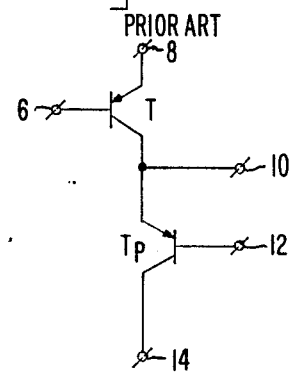

FIG. 2 shows two equivalent diagrams of this vertical transistor structure. The transistor T in FIG. 2a is constituted by the collector region 3, the base region 4 and the emitter region 7 of FIG. 1 and comprises the emitter terminal 8, a base terminal 6 and a collector terminal 10. As is apparent from FIG. 1, a pn-junction is provided between the regions 2 and 3, and an opposite pn-junction is provided between the regions 1 and 2. In FIG. 2a these junctions are represented diagrammatically as capacitive diode elements D1 and D2. The combination of these two junctions may be regarded as a parasitic transistor Tp, as is indicated diagrammatically in FIG. 2b.

As is apparent both from FIG. 2a and from FIG. 2b, the influence of these parasitic elements D1, D2 or Tp is eliminated by bringing the layer 2 to a comparatively high voltage via the terminal 12. As a result of this the two parasitic junctions are cut off. If this is effected for two such transistors which are together included in a current-mirror arrangement, this will yield the equivalent diagram shown in FIG. 3.

Figure 3:
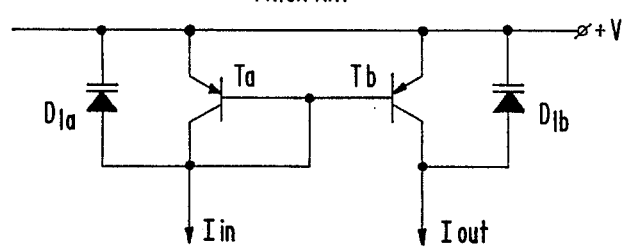
FIG. 3 shows the arrangement which would be obtained if, in known manner, the intermediate layer between the collector regions of the transistors and the substrate would be connected to the power-supply voltage or to the emitters of the relevant transistors.

FIG. 3 shows the transistors Ta and Tb which are together included in a current-mirror arrangement. Both transistors have their emitters coupled to the power-supply line +V, and have their bases interconnected and connected to the collector of the transistor Ta. The input current Iin flows through the transistor Ta and the output current Iout flows through the transistor Tb. If these two transistors Ta and Tb are constructed as integrated vertical transistors and if, as indicated above, the intermediate isolating layers 2 are connected to the power-supply line +V via the relevant connections, the parasitic capacitive diodes D1a and D1b, as is shown in FIG. 3, will be arranged in parallel with the main current paths of the transistors Ta and Tb, respectively. These two parasitic capacitances D1a and D1b give rise to an undesired high-frequency pole in the transfer function between Iin and Iout. Moreover, it will be evident that high-frequency spurious signals appearing on the power-supply line +V can be superimposed on the output current Iout via D1b.

Figure 4:
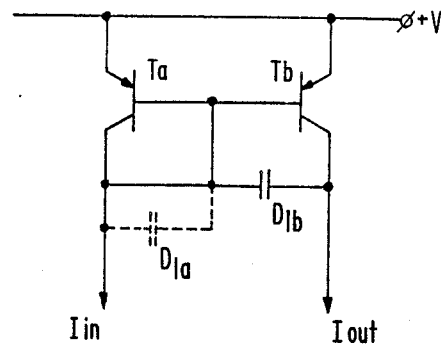
FIG. 4 shows the arrangement obtained if the various regions are connected to each other in a manner as proposed by the invention.

FIG. 4 illustrates how these problems can be eliminated in accordance with the invention. FIG. 4 again shows the transistors Ta and Tb included in a current-mirror arrangement connected to the power-supply line +V. The isolating layer 2 of each transistor, however, is now connected to the interconnected bases of the two transistors Ta and Tb via the relevant connection terminal. The result of this is that the capacitance D1a is in fact short-circuited and hence no longer plays a part. Therefore, this capacitance is indicated in broken lines. The capacitance D1b is now arranged across the base-collector junction of Tb. In this way said undesired pole in the high-frequency transfer function from the input Iin to the input Iout is eliminated effectively. Moreover, the capacitive path for interference signals from the power-supply line +V to the output Iout is thus eliminated effectively. Moreover, a direct high-frequency connection is established between the input and the output of the current mirror arrangement via D1b, which direct high-frequency connection is known as a bypass or feed-forward connection.

Figure 5:
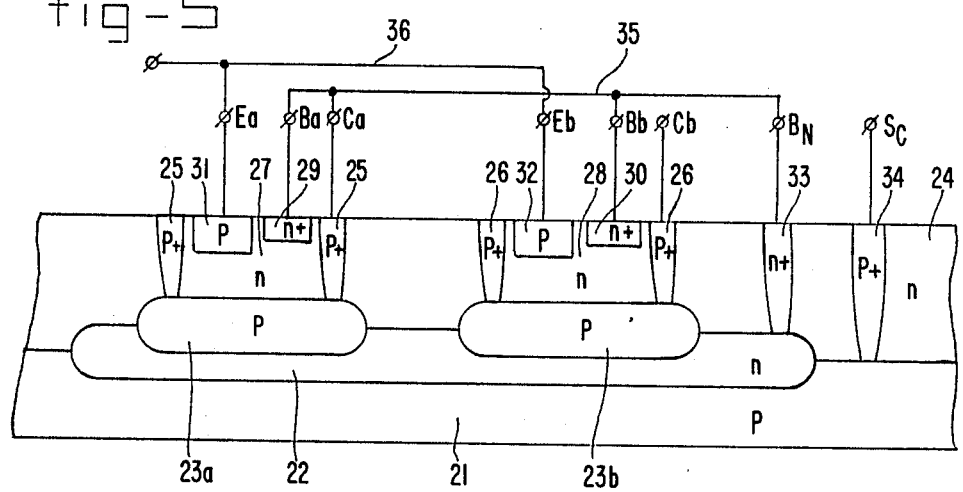
FIG. 5 is a sectional view of an integrated structure comprising two vertical transistors arranged in a current-mirror arrangement in accordance with the invention.

FIG. 5 shows how this circuit arrangement can be realized in integrated form by means of vertical transistor structures, using a comparatively small number of differently doped regions. In FIG. 5 the p-type substrate has the reference numeral 21. On this substrate an n-type intermediate layer 22 is arranged on which two p-type collector regions 23a and 23b are formed. On this layer structure an n-type epitaxial layer 24 is formed. In this epitaxial layer 24 two separate base regions 27 and 28 are bounded by two deep annular diffusions 25 and 26. By means of separate n+ doped regions 29 and 30 the base contacts Ba and Bb are formed. In these base regions the emitter regions 31 and 32 are formed by p-doped regions provided with the respective emitter terminals Ea and Eb. Said deep annular doped regions 25 and 26 are provided with the collector terminals Ca and Cb. A further deep n-doped region 33 reaches down to the intermediate layer 22 and at its upper side it is provided with the terminal Bn. If desired a further deep doped region 34 may be used which extends down to the substrate and which may be provided with a separate substrate contact Sc.

As is shown in FIG. 5, an external conductive connection 35 is provided which interconnects the contacts Ba, Ca, Bb and Bn with each other. A second conductive connection 36 interconnects the contacts Ea and Eb. A comparison between FIG. 4 and FIG. 5 shows that it is merely necessary to apply the supply voltage +V to the connection 36, the input and output currents Iin and Iout will then flow via the two collector terminals Ca and Cb.

Figure 6:
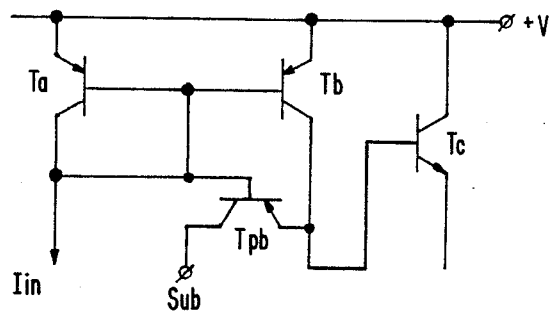
FIG. 6 shows a power output stage driven by a current-mirror arrangement in accordance with the invention.

FIG. 6 shows a further use of the inventive principle in a power output stage in which the current-mirror arrangement is coupled to an output transistor. The actual current-mirror arrangement again comprises the transistors Ta and Tb and the output stage comprises the transistor Tc. If, in accordance with the inventive principle, the intermediate collector isolating layers are coupled to the interconnected bases of the transistors Ta and Tb, the parasitic structure of the transistor Ta is elminated completely. The parasitic structure of Tb, in the present case represented as a parasitic transistor Tpb, is then arranged as shown in FIG. 6. The emitter of this parasitic structure is coupled to the collector of the transistor Tb, the base of Tbp is coupled to the interconnected bases of the transistors Ta and Tb, and the collector is connected to the substrate contact.

If the collector-emitter voltage of the output transistor Tc becomes smaller than the base-emitter voltage ($\approx 0.6$ V) the parasitic transistor Tpb becomes conductive. Consequently, a part of the collector current of Tb will flow to the substrate via said parasitic transistor Tpb so that base current is drawn from the output transistor Tc. As a result of this the output transistor Tc cannot be saturated, which is generally a desirable feature in power output stages.

What is claimed is:

1. An integrated current-mirror arrangement comprising a first and a second transistor whose bases are interconnected and coupled to a collector of the first transistor, wherein the transistors are constucted as vertical transistors each having a collector region of a first conductivity type, isolated from a substrate of the first conductivity type by an intermediate layer of a second conductivity type, a connection being provided between said intermediate layer and the interconnected bases of the two transistors.

2. An integrated current-mirror arrangement as claimed in claim 1 employed as a driver stage for an output transistor whose main current path is coupled to interconnected emitters of the two current-mirror transistors, a base of the output transistor being connected to the collector of the second current-mirror transistor.

3. An integrated current-mirror arrangement comprising: a first and a second vertical type transistor having their bases interconnected and coupled to a collector of the first transistor, wherein the first and second transistors each have a collector region of a first conductivity type isolated from a substrate of the first conductivity type by a common intermediate layer of a second conductivity type, a connection being provided between said intermediate layer and the interconnected bases of the two transistors.

4. An integrated current-mirror arrangement as claimed in claim 3 employed as a driver stage for an output transistor whose main current path is coupled to interconnected emitters of the two current-mirror transistors, a base of the output transistor being connected to the collector of the second current-mirror transistor.

5. An integrated current-mirror arrangement comprising: first and second vertical type transistors formed on a substrate of a first conductivity type, each of said transistors having first and second main electrode regions and a base electrode region wherein the base electrode regions are interconnected and are coupled to a first main electrode region of the first transistor, said second main electrode regions being connected to a terminal for a source of supply voltage and said first main electrode region of the second transistor forming an output of the current-mirror arrangement, said first main electrode regions being of the first conductivity type and being isolated from said substrate by at least one intermediate layer of a second conductivity type, and wherein a direct connection is provided between said at least one intermediate layer and the interconnected base regions of the first and second transistors.

6. An integrated current-mirror arrangement as claimed in claim 5, wherein said second main electrode regions are inteconnected, said arrangement further comprising an output transistor having a main current path coupled to said interconnected second main electrode regions of the first and second transistors and a base connected to the output of the current-mirror.

* * * * *